United States Patent
Winograd et al.

(10) Patent No.: US 7,751,225 B2
(45) Date of Patent: Jul. 6, 2010

(54) DENSE READ-ONLY MEMORY

(75) Inventors: Gil I. Winograd, Aliso Viejo, CA (US); Morteza Cyrus Afghahi, Coto De Caza, CA (US); Esin Terzioglu, Aliso Viejo, CA (US)

(73) Assignee: Novelics, LLC, Aliso Viejo, CA (US)

( * ) Notice: Subject to any disclaimer, the term of this patent is extended or adjusted under 35 U.S.C. 154(b) by 47 days.

(21) Appl. No.: 12/016,726

(22) Filed: Jan. 18, 2008

(65) Prior Publication Data
US 2008/0225568 A1 Sep. 18, 2008

Related U.S. Application Data

(63) Continuation of application No. PCT/US2006/061255, filed on Nov. 27, 2006.

(60) Provisional application No. 60/739,718, filed on Nov. 25, 2005.

(51) Int. Cl.
*G11C 17/00* (2006.01)
(52) U.S. Cl. ............. 365/104; 365/185.25; 365/185.17; 365/185.26
(58) Field of Classification Search ................. 365/104, 365/185.25, 185.17, 185.26
See application file for complete search history.

(56) References Cited

U.S. PATENT DOCUMENTS

| 4,142,176 | A | * | 2/1979 | Dozier ........................ 326/44 |
| 4,602,354 | A | | 7/1986 | Craycraft et al. |
| 5,969,990 | A | * | 10/1999 | Arase .................... 365/185.25 |
| 6,542,396 | B1 | | 4/2003 | Becker |
| 7,177,191 | B2 | * | 2/2007 | Fasoli et al. ............ 365/185.17 |
| 7,233,522 | B2 | * | 6/2007 | Chen et al. ............. 365/185.02 |
| 2004/0233693 | A1 | | 11/2004 | Evans et al. |

OTHER PUBLICATIONS

ISR for PCT/US06/61255.
European Search Report for 06849059.8-2210/1955/62.

* cited by examiner

*Primary Examiner*—Connie C Yoha
(74) *Attorney, Agent, or Firm*—Haynes & Boone, LLP.

(57) ABSTRACT

In one embodiment, a read-only memory (ROM) is provided that includes: a plurality of word lines; a plurality of bit lines; a plurality of memory cell transistors arranged in rows corresponding to the word lines such that if a word line is asserted the corresponding memory cell transistors are conducting, the memory cell transistors also being arranged in columns corresponding to the bit lines; wherein each column of memory cell transistors is arranged into column groups, each column group including an access transistor coupled to the corresponding bit line, the remaining transistors in the column group being coupled in series from the access transistor to a last transistor in the column group, the last transistor in the column group being coupled to a voltage node.

12 Claims, 3 Drawing Sheets

US 7,751,225 B2

DENSE READ-ONLY MEMORY

RELATED APPLICATION

This application is a Continuation of International Application No. PCT/US2006/61255, filed Nov. 27, 2006, which in turn claims the benefit of U.S. Provisional Application No. 60/739,718, filed Nov. 25, 2005.

TECHNICAL FIELD

This application relates generally to integrated circuits, and more particularly to a dense read-only memory (ROM).

BACKGROUND

Integrated circuit read-only memories (ROMs) may generally be classified into two types: NOR-based ROMs and NAND-based ROMs. In both these types of ROMS, the memory cells are arranged in rows corresponding to wordlines and in columns corresponding to bit lines. A distinction between the two ROM classifications lies in how the columns of memory cells are coupled to their corresponding bit lines. In a NOR-based ROM, each memory cell in a column of memory cells may have a first terminal directly coupled to its corresponding bit line and a second terminal coupled to ground. For example, in an NMOS NOR-based ROM embodiment, each memory cell would comprise an NMOS transistor having its source coupled to ground and its drain coupled to the bit line. In contrast, in a NAND-based ROM, the columns are arranged into memory cells groups such that only one memory cell at the end of each group has a terminal directly coupled to the bit line. A transistor at the remaining end of the group has a terminal coupled to ground. In both types of ROM, the gates of the memory cells are controlled by the corresponding word line.

Given these arrangements, it may be seen that the memory cells in a NOR-based ROM column will all couple in parallel to the corresponding bit line. A NOR-based ROM bit line will be pulled low if any of its memory cells in the corresponding column are turned on because there will then be a path to ground through the conducting memory cell transistor. Thus, the column of memory cells collectively act as a NOR gate with regard to their word lines, thereby leading to the "NOR-based" denotation. Conversely, the memory cells in a NAND-based ROM column group are coupled in series. In such a case, the bit line will be pulled low only if all of the memory cells in the group are conducting. Thus, the memory cells in the group collectively act as a NAND gate with regard to their word lines, thereby leading to the "NAND-based" denotation.

Various techniques have been developed to program these ROMs. For example, the diffusion regions of the memory cell transistors may be programmed to either couple to or not couple to the bit line. Alternatively, the source and drain of a memory cell may be shorted using either via or metal layer programming. Regardless of the type of programming, each ROM type has its advantages and corresponding disadvantages. NAND-based ROMs are denser than NOR-based ROMs but have slower access times. Thus, a ROM designer has been forced to choose between speed and density when selecting between either a NOR-based or NAND-based design. Accordingly, there is a need in the art for ROMs having the density advantages of a NAND-based architecture yet offering the speed advantages of a NOR-based architecture.

SUMMARY

This section summarizes some features of the invention. Other features are described in the subsequent sections.

In one embodiment, a read-only memory (ROM) is provided that includes: a plurality of word lines; a plurality of bit lines; a plurality of memory cell transistors arranged in rows corresponding to the word lines such that if a word line is asserted the corresponding memory cell transistors are conducting, the memory cell transistors also being arranged in columns corresponding to the bit lines; wherein each column of memory cell transistors is arranged into column groups, each column group including an access transistor coupled to the corresponding bit line, the remaining transistors in the column group being coupled in series from the access transistor to a last transistor in the column group, the last transistor in the column group being coupled to a voltage node.

In another embodiment, a read-only memory (ROM) is provided that includes: a plurality of memory cell transistors, each memory cell transistor including diffusion regions, each diffusion region including a contact; wherein at least one of the memory cell transistors is a programmed memory cell transistor, each programmed memory cell transistor having its contacts shorted through an overlaying metal connection, wherein the contacts of non-programmed memory cell transistors do not couple to overlaying metal patches.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

As discussed previously, the memory cells in a ROM may be arranged in a row and column fashion, where each row of memory cells corresponds to a word line and each column of memory cells corresponds to a bit line. To provide the advantages of NAND-based ROM density with NOR-based ROM speed advantages, the columns of memory cells are arranged in groups. However, unlike a traditional NAND-based ROM, each group of memory cells also includes an access transistor. As used herein, the resulting group of transistor will be referred to as a "column group" to distinguish it from the columnar group of transistors used in conventional NAND-based ROM. The column group couples to its bit line through the access transistor, which resides at a first end of the column group. A transistor at the remaining end of the column group couples to a voltage node (for example, ground or a power supply voltage node). To read the contents of a memory cell, both the access transistor and the remaining word lines in the corresponding column group are turned on while the memory cell's transistor is turned off. If the memory cell is not programmed, the corresponding bit line should only be coupled to the voltage node if the memory cell's transistor is conducting. If the memory cell's transistor is not conducting, the corresponding bit line should be isolated from the voltage node. However, if the corresponding bit line is coupled to the voltage node even though the memory cell's transistor is not conducting, the memory cell may be deemed as programmed. The binary state assigned to the programmed and non-programmed states is arbitrary. The following discussion will consider the non-programmed state to correspond to a logical "0" value whereas the programmed state corresponds to a logical "1" value. However, it will be appreciated that a complementary assignment of binary values could also be used.

Figure 1:
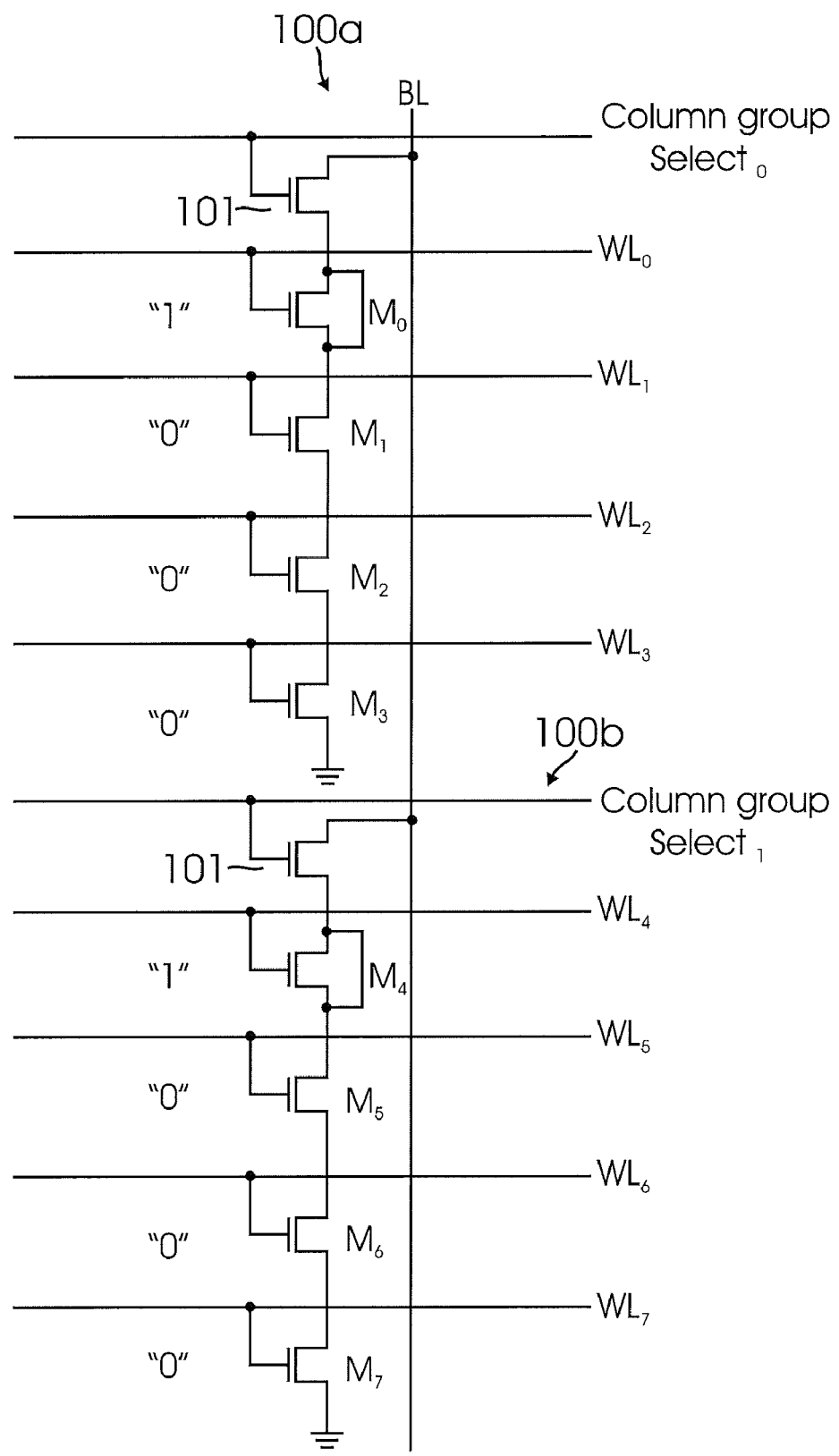
FIG. 1 is a schematic illustration of a read-only memory column group and its bit and word lines.

Turning now to the drawings, FIG. 1 illustrates two column groups 100a and 100b. The number of memory cells per column group is arbitrary. For illustration purposes, each column group includes four memory cells. For example, column group 100a includes four memory cells corresponding to word lines $WL_0$ though $WL_3$ whereas column group 100b includes four memory cells corresponding to word lines $WL_4$ though $WL_7$. The column groups are formed using NMOS transistors but it will be appreciated that PMOS transistors could also have been used. The bit line corresponding to the column groups is denoted as BL. As known in the art, the bit line and word lines may be formed in different layers of the semiconductor manufacturing process used to form the integrated circuit memory that includes column group 100. For example, the word lines may be formed using the polysilicon layer whereas the bit line may be formed using a semiconductor manufacturing process metal layer such as a second metal layer overlaying the polysilicon layer (but separated by oxide from other metal layers as known in the art).

Each memory cell comprises a transistor having its gate coupled to the corresponding word line. For example, a first memory cell comprises a transistor $M_0$ having its gate controlled by word line $WL_0$, a second memory cell comprises a transistor $M_1$ having its gate controlled by word line $WL_1$, and so on. All the memory cells in each column group are coupled in series to the bit line BL through an access transistor 101 whose gate is controlled by a column group select line. For example, a column group select line 0 controls the access transistor for column group 100a whereas a column group select line 1 controls the access transistor for column group 100b. Given this configuration, a memory cell transistor may be considered to be programmed if it is conducting despite having its gate voltage be such that no channel is induced between its source and drain. In other words, a memory cell transistor may be considered to be programmed if it is conducting despite being turned off (with regard to its gate voltage). A programmed memory cell transistor thus has its source shorted to its drain. In column group 100a, memory cell transistor $M_0$ is programmed whereas the remaining memory cells are non-programmed. Similarly, in column group 100b, memory cell transistor $M_4$ is programmed whereas the remaining memory cells are non-programmed.

The use of the column group select lines leads to significant speed advantages over traditional NAND-based ROM designs. In particular, most ROMS will have many word lines and corresponding memory cells. For example, a ROM may have sixty-four word lines and corresponding memory cells per bit line. Thus, each column of memory cells in such a ROM would have sixty-four memory cells. In a conventional NAND-based ROM, these sixty-four memory cells would be coupled in series between the bit line and ground. Because they are coupled in series, the resistance of the resulting coupling is sixty-four times that of the resistance of a single memory cell. Moreover, the capacitance is also similarly multiplied with regard to the series-coupled memory cells. Thus, a conventional NAND-based ROM is quite slow to access and read any given memory cell. In sharp contrast, the column of memory cells shown in FIG. 1 is arranged into column groups, each column group being accessed through a corresponding access transistor and column select line. Thus, for just a small sacrifice in density through the addition of the access transistor, the column group offers significant speed advantages over the grouping in traditional NAND-based ROM design in that just a subset of the memory cells corresponding to any given bit line will be assigned to a corresponding column group. In this fashion, the column group's overall resistance and capacitance and hence access speed will not be burdened as the number of memory cells in the ROM is increased.

A variety of techniques may be used to short a programmed memory cell. For example, a diffusion programming may be performed where the channel of a programmed cell is doped so as to provide a zero threshold voltage. Alternatively, a via or metal programming technique may be used. The following discussion will assume that a metal programming technique is implemented. However, it will be appreciated that alternative programming techniques such as, for example, diffusion programming may also be used. A metal programming technique has the advantages of being simpler to implement through mask programming and also offers certain density advantages. A metal programming technique may be better understood with reference to FIG. 2a, which illustrates a cross-sectional view of memory cell transistors $M_0$ and $M_1$ in column group 100. Transistor $M_0$ includes diffusion regions 200 and 205 in a substrate 210 whereas transistor $M_1$ includes diffusion region 205 and 215. For improved density, the diffusion regions are shared between adjacent transistors. Thus, a drain for a given transistor is the source for an adjacent transistor. Conversely, a source for a given transistor is the drain for an adjacent transistor. Because of this dual function for the shared diffusion regions 200, 205, and 215, each one is labeled as a drain/source (D/S).

The diffusion regions may be coupled together through channels induced by the word lines such as word lines $WL_0$ and $WL_1$. In a non-programmed memory cell such as transistor $M_1$, diffusion regions 205 and 215 can only be electrically coupled if the corresponding word line $WL_1$ has a voltage sufficient to induce a channel in the substrate. However, in a programmed memory cell such as transistor $M_1$, the corresponding diffusion regions 200 and 205 are electrically coupled through a strap such as a strap 220 formed using a semiconductor manufacturing process metal layer such as a first metal layer (metal1). Each diffusion region is provided with a contact 225 so as to electrically couple to any overlaying strap in the first metal layer. Alternatively, other metal layers could be used to form the strap, which would have to couple to the contacts using appropriate vias.

Figure 2A:
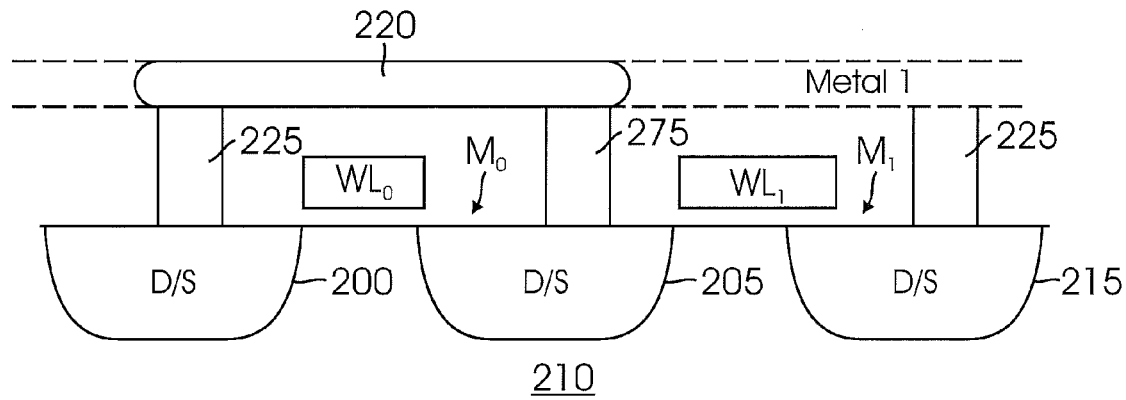
FIG. 2a is a cross-sectional view of a programmed memory cell and a non-programmed memory cell in which each diffusion region for the transistors in the memory cell includes a contact.
Figure 2B:
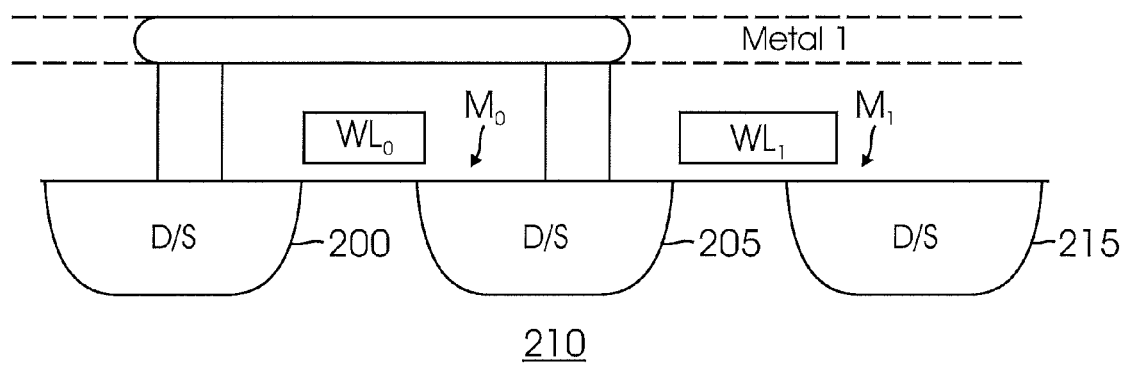
FIG. 2b is a cross-sectional view of a programmed memory cell and a non-programmed memory cell in which only the diffusion regions for programmed memory cell transistors include contacts.
Figure 2C:
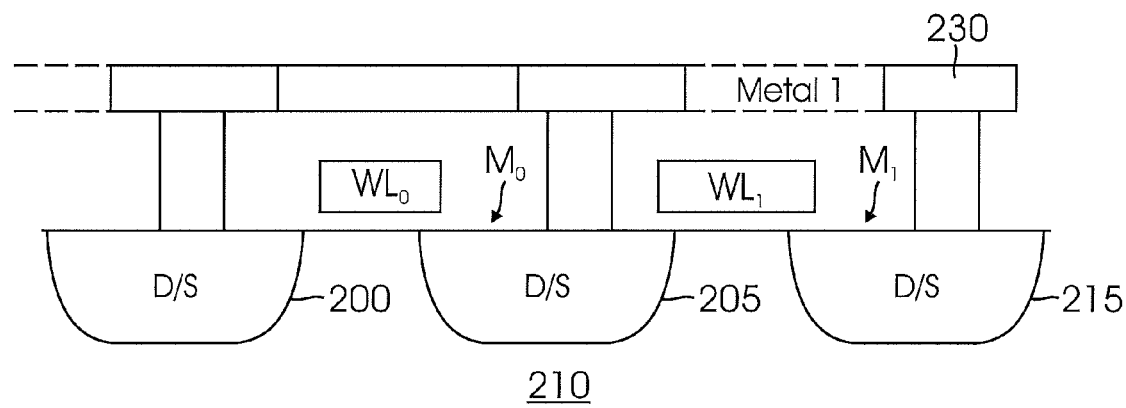
FIG. 2c is a cross-sectional view of a programmed memory cell and a non-programmed memory cell in which each diffusion region for the transistors in the memory cell includes a contact with an overlaying metal patch.

In an alternative embodiment illustrated in FIG. 2b, only the diffusion regions in programmed transistors would include a contact 225. However, a designer need merely affect the mask used to form metal layer metal1 to program or not program a memory cell with regard to FIG. 2a whereas the masking used to form the contacts must also be altered for FIG. 2b. Referring now to FIG. 2c, an advantage for the embodiment of FIG. 2a may be highlighted. It is conventional in semiconductor processing to include a patch 230 over contacts that are not used such as contact 225 coupling to diffusion region 215. However, this patch is a manufacturing step that arises from conventional aluminum metal layer semiconductor processing techniques. As semiconductor dimensions have been shrunk into the deep submicron regime (such as 130 nm, 90 nm, 65 nm, and smaller regimes), copper has now replaced aluminum as the preferred metal to form the metal layers. The applicants have discovered that despite semiconductor foundry rules to the contrary, the patches may be disregarded as shown in FIG. 2a. By not including patches on the contacts for non-programmed transistors, density is notably enhanced.

Column group 100 is formed using NMOS transistors but it will be appreciated that PMOS transistors could also have been used. Moreover, the voltage node that the final transistor in the column group (for column group 100, transistor $M_3$) couples to may be a power supply voltage node rather than a ground as illustrated in FIG. 1.

Figure 3:
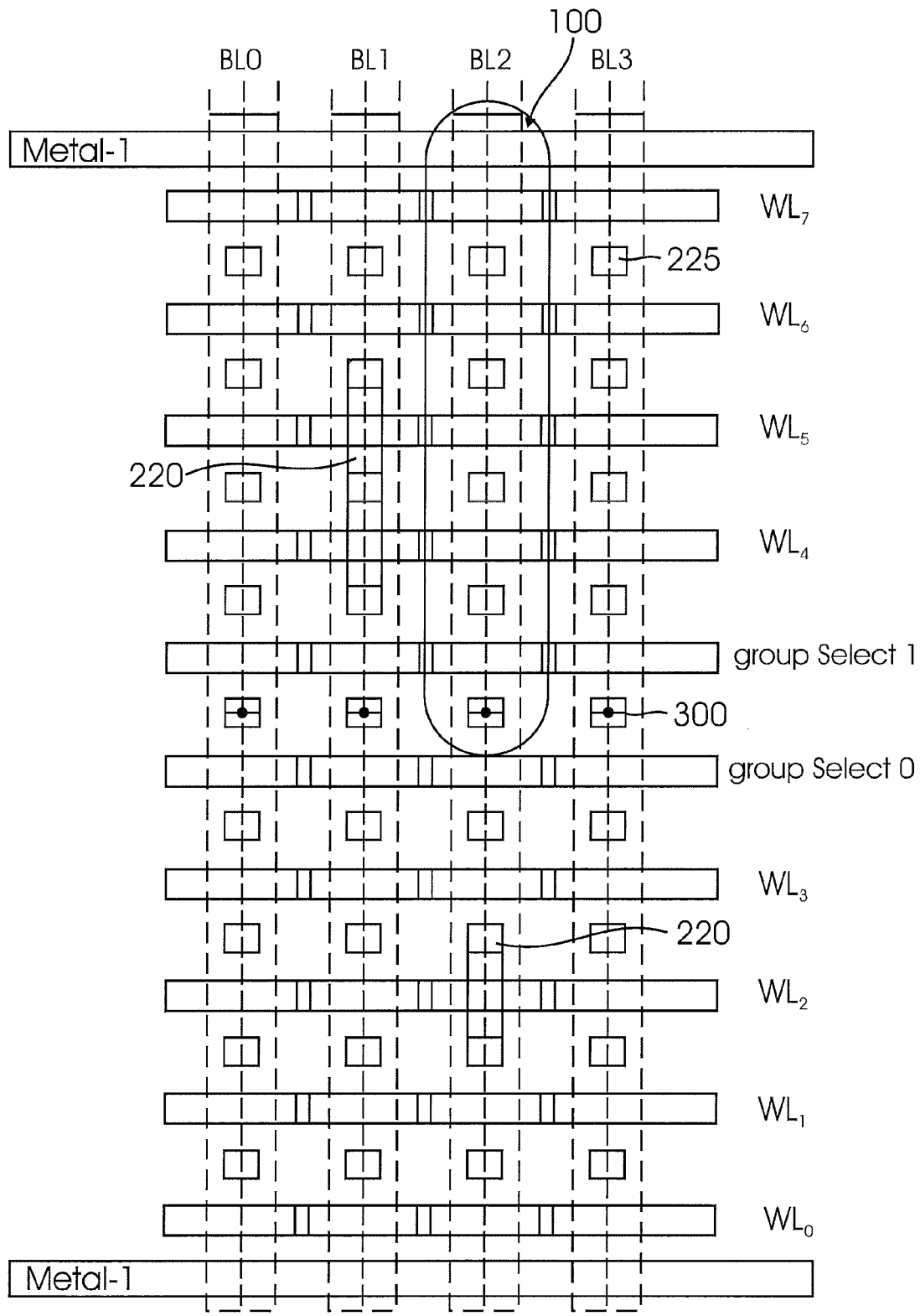
FIG. 3 is a layout view of a read-only memory including a plurality of column groups.

An example ROM layout is illustrated in FIG. 3 for a plurality of column groups 100 corresponding to bit lines BL0 through BL3. To enhance density, the column groups may be arranged symmetrically with regard to a set of bit line contacts 300 that enable the bit lines to couple to the access transistors (shown in FIG. 1) whose gates underlie group select lines 1 and 0. Thus, bit line contact 300 and the diffusion region it couples to are shared by the corresponding access transistors. This sharing of the bit line contacts is advantageous for both density and access speed purposes. The ROM layout shown in FIG. 3 corresponds to the cross-sectional view shown in FIG. 2a in that each diffusion region has a corresponding contact 225. To read the contents of memory cells corresponding to word lines WL0 through WL3, group select line 0 is asserted while group select line 1 is de-asserted. In that regard, it will be understood that the voltage level corresponding to "asserted" depends upon whether the corresponding ROM is formed using NMOS or PMOS transistors in that a word line or group select line is said to be asserted if its voltage is such so as to induce a channel in the underlying memory cell or access transistors. Thus, in a PMOS embodiment, a line is brought low to be asserted whereas in an NMOS embodiment a line is brought high to be asserted. To read the contents of a memory cell within a column group, the word line corresponding to the memory cell is asserted while the remaining word lines in the column group as well as the corresponding group select line are asserted. Programmed memory cells have their contacts shorted through a metal strap 220 as discussed previously. To reduce leakage currents, the word lines may all be asserted while the column group select lines are not asserted during quiescent non-access modes of operation.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A read-only memory (ROM), comprising:
a plurality of word lines;
a plurality of bit lines;
a plurality of memory cell transistors arranged in rows corresponding to the word lines such that if a word line is asserted the corresponding memory cell transistors are conducting, the memory cell transistors also being arranged in columns corresponding to the bit lines;
wherein each column of memory cell transistors is arranged into column groups, and wherein each memory cell transistor includes diffusion regions, each diffusion region having a contact, each column group including an access transistor coupled to the corresponding bit line, the remaining transistors in the column group being coupled in series from the access transistor to a last transistor in the column group, the last transistor in the column group being coupled to a voltage node, and wherein at least one of the memory cell transistors is as programmed memory cell transistor, each programmed memory cell transistor being shorted through a metal connection between the programmed memory cell transistor's contacts, the metal connection being formed in a semiconductor manufacturing metal layer overlaying the contacts such that it is conducting regardless of whether the corresponding word line is asserted, and wherein the contacts of non-programmed memory cell transistors do not couple to overlaying metal patches.

2. The ROM of claim 1, wherein the voltage node is a ground node.

3. The ROM of claim 1, wherein the voltage node is a power supply node.

4. The ROM of claim 1, wherein each column group comprises 8 memory cell transistors.

5. The ROM of claim 1, wherein each column group comprises 4 memory cell transistors.

6. A read-only memory (ROM), comprising:
a plurality of memory cell transistors, each memory cell transistor including diffusion regions, each diffusion region including a contact; wherein at least one of the memory cell transistors is a programmed memory cell transistor; each programmed memory cell transistor having its contacts shorted through an overlaying metal connection, wherein the contacts of non-programmed memory cell transistors do not couple to overlaying metal patches.

7. The ROM of claim 6, further comprising:
a plurality of word lines;
a plurality of bit lines;
wherein the plurality of memory cell transistors are arranged in rows corresponding to the word lines such that if a word line is asserted the corresponding memory cell transistors are conducting, the memory cell transistors also being arranged in columns corresponding to the bit lines; and wherein each column of memory cell transistors is arranged into column groups, each column group including an access transistor coupled to the corresponding bit line, the remaining transistors in the column grout being coupled in series from the access transistor to a last transistor in the column group, the last transistor in the column grout being coupled to a voltage node.

8. The ROM of claim 6, wherein the voltage node is a ground node.

9. The ROM of claim 6, wherein the voltage node is a power supply node.

10. The ROM of claim 6, wherein the metal connections are formed in a semiconductor manufacturing metal layer overlaying the contacts.

11. The ROM of claim 6, wherein each column group comprises 8 memory cell transistors.

12. The ROM of claim 6, wherein each column group comprises 4 memory cell transistors.

* * * * *